US008395082B2

(12) United States Patent
Zhang et al.

(10) Patent No.: US 8,395,082 B2
(45) Date of Patent: Mar. 12, 2013

(54) SOLID-STATE LASER LIFT-OFF APPARATUS

(75) Inventors: Guoyi Zhang, Dongwan (CN); Xinrong Yang, Dongwan (CN); Mingkun He, Dongwan (CN); Yongjian Sun, Dongwan (CN)

(73) Assignee: Sino Nitride Semiconductor Co., Ltd., Dongguan, Guang Dong (CN)

( * ) Notice: Subject to any disclaimer, the term of this patent is extended or adjusted under 35 U.S.C. 154(b) by 0 days.

(21) Appl. No.: 13/318,663

(22) PCT Filed: May 5, 2010

(86) PCT No.: PCT/CN2010/072466
§ 371 (c)(1),
(2), (4) Date: Nov. 3, 2011

(87) PCT Pub. No.: WO2010/127621
PCT Pub. Date: Nov. 11, 2010

(65) Prior Publication Data
US 2012/0064735 A1 Mar. 15, 2012

(30) Foreign Application Priority Data
May 8, 2009 (CN) .......................... 2009 1 0136457

(51) Int. Cl.
*B23K 26/00* (2006.01)
*B23K 16/02* (2006.01)

(52) U.S. Cl. ......... 219/121.67; 219/121.68; 219/121.78; 219/121.83

(58) Field of Classification Search ............. 219/121.67, 219/121.68, 121.69, 121.78, 121.82, 121.7, 219/121.71, 121.72, 121.83; 438/22, 46, 438/458, 669, 795; 156/712, 753
See application file for complete search history.

(56) References Cited

U.S. PATENT DOCUMENTS
6,960,739 B2 * 11/2005 Liu et al. .................. 219/121.69
8,258,426 B2 *  9/2012 Zhang et al. ............. 219/121.67

* cited by examiner

*Primary Examiner* — Dung A. Le
(74) *Attorney, Agent, or Firm* — SV Patent Service

(57) ABSTRACT

A solid-state laser lift-off apparatus comprises: a solid-state laser (1), a light beam shaping lens (3), motors of oscillating mirrors (5,7), oscillating mirrors (4,6), a field lens (9), a movable platform (10), an industrial control computer and control software (8). The light beam shaping lens (3) is behind the solid-state laser (1), shaping the laser beam from the solid-state laser (1) into required shape. The motors of oscillating mirrors (5,7) are in front of the field lens (9), controlling the movement of the oscillating mirrors (4,6) according to the instruction of the control software (8) to implement different light beam scanning paths. A lift-off method for applying the solid-state laser lift-off apparatus uses a small laser spot to perform scanning, and enables damage-free separation of GaN from a sapphire substrate.

8 Claims, 6 Drawing Sheets

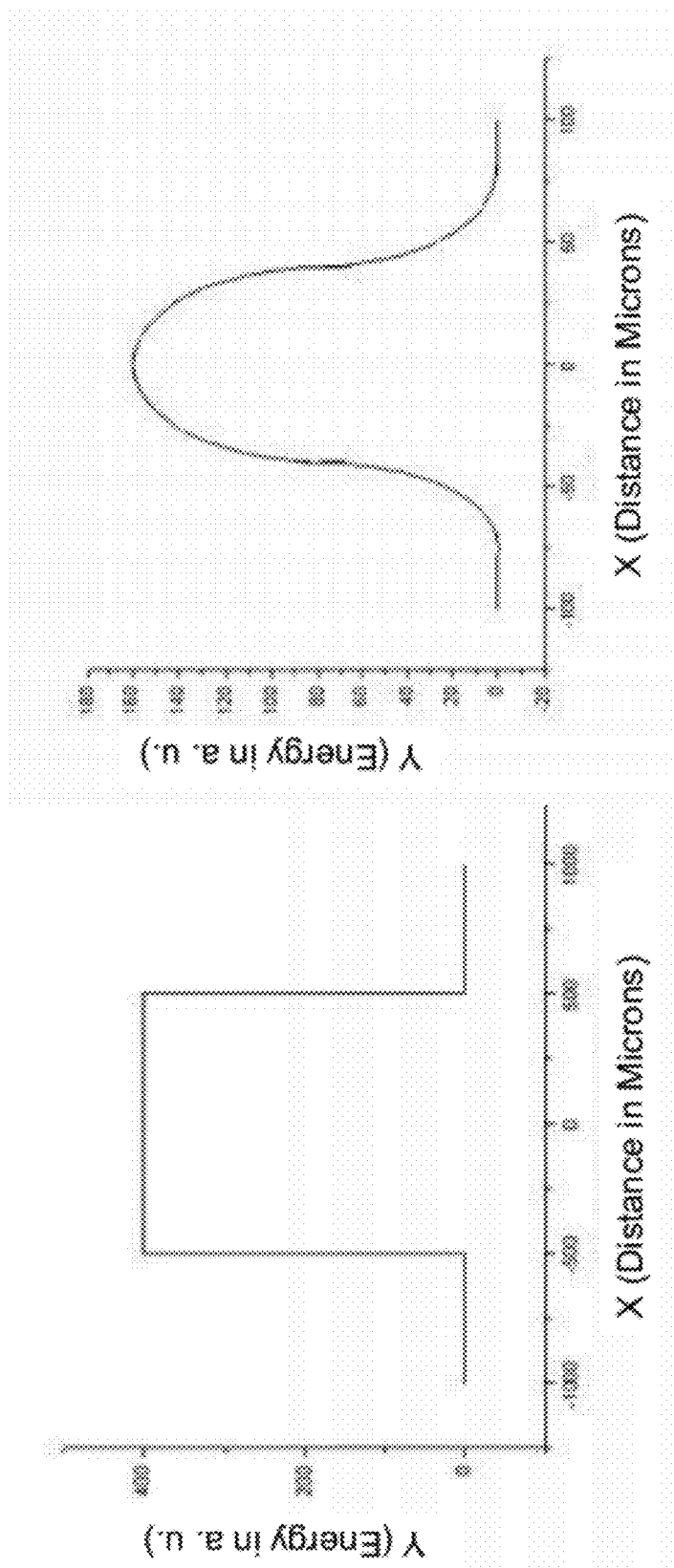

SOLID-STATE LASER LIFT-OFF APPARATUS

CROSS-REFERENCE TO RELATED APPLICATIONS

The present application is a national-entry application based on and claims priority to PCT Patent Application PCT/CN2010/072466, entitled "Solid-state laser lift-off apparatus and lift-off method" by the same inventors, filed May 5, 2010, which claims priority to Chinese Patent Application No. CN200910136457.4, filed May 8, 2009. The content of these applications is incorporated herein by reference.

TECHNICAL FIELD

The present invention relates to the technical field of semiconductor manufacturing, in particular, a kind of semiconductor film lift-off apparatus and lift-off method for applying solid-state laser to separate film materials. The present invention enables a laser beam to be shaped into specific shapes and specific distributions of optical fields through special light paths, and decomposes the interface materials by focusing the laser on the interfaces between the multiple layers, so as to achieve the separation of the film layer from the substrate.

BACKGROUND OF THE INVENTION

In recent years, III/V nitride materials, mainly GaN, InGaN, and AlGaN, have received much attention as semiconductor materials. Due to their continuous and variable direct band gap from 1.9 to 6.2 eV, excellent physical and chemical stability, and high saturation electron mobility, the III/V nitride materials are the most preferred materials for optoelectronic devices such as laser devices and light-emitting diodes.

Due to the limitation in the growth technologies of GaN, however, large area of GaN materials are mostly grown on sapphire substrates. Although the GaN grown on a sapphire substrate has high quality and wide applications, the development of GaN based semiconductor devices is largely limited by the non electro-conductivity and poor thermal-conductivity of the sapphires. In order to avoid such disadvantages, methods have been invented to replace the sapphires substrate after the growth of GaN based devices on sapphires. The GaN film can be transferred to a better heat-sink bonding or be used as a kind of homo-epitaxial substrate after the substrate is lifted off. A commonly applied method for the removal of sapphire is laser lift-off technology.

The laser lift-off (LLO) technique was first implemented by HP company on AlGaInP/GaAs LED because the GaAs substrate leads to a very high light absorption loss inside the LED. The light-emitting efficiency can be increased nearly 2 times by removing the GaAs substrate and then adhered to a transparent GaP substrate. GaN based laser lift-off technology was first introduced by M. K. Kelly et al. in US in 1996 as part of hetero epitaxial growth technologies. A thick GaN film grown by hydrogen vapor epitaxial (HVPE) is lifted off using a third-harmonic frequency YAG laser from the sapphire substrate. In 1998, W. S. Wong et al. made GaN based LED and laser diodes using LLO technology. The laser lift-off techniques have received extensive attention.

The laser lift-off technology resolves a series of problems associated with GaN based LED on sapphire substrate, including: heat emission, current crowding, and low light-emitting efficiency. LLO is the most prospective technology to overcome the above mentioned obstacles in lighting applications. Firstly, by transferring the epitaxial wafer to a heat sink having high thermal-conductivity, the heat dissipation of the LED device is much improved and the LED junction temperature is lowered. The reduction of LED junction temperature significantly improves light-emitting efficiency and stability of the LED, and increases LED's lifetime. The lift-off technology can also substantively reduce fabrication costs in conventional processes such as etching, wafer abrasion, wafer scribing, etc. The cost is also reduced by repeated use of the lift-off substrate.

The IX-1000 laser lift-off apparatus of US JPSA company is the main commercialized laser lift-off apparatus at the present time. It applies high-power KrF quasi-molecule laser with 248 nm wavelength and 25-38 ns pulse width. Through accurate control on the energy and uniformization of the light beam energy distribution, the laser focuses on the GaN buffer layer to decompose the GaN into gallium and nitrogen so as to implement the separation of GaN from the substrate. A YAG third harmonic frequency solid-state laser with Q switch is also used besides the KrF quasi-molecule laser, mainly by the M. K. Kelly group in the US and R. H. Horng group in Taiwan. The solid-state laser can achieve a rather high pulse energy through Q switch technology. Moreover, it is convenient to be maintained. However, such techniques have not been commercialized due to their technical limitations.

The above-mentioned lift-off methods have the following characteristics:

1. Applying lift-off techniques chip by chip. Substrate separation is achieved by a large laser spot (with laser spot size larger than or equal to the chip size).

2. The size of the laser spot is dependent on the size of the device (chip).

3. The laser spot has a uniform energy distribution with a flat range at the top of the energy distribution.

4. The laser spot has high energy density of generally more than 0.6 J/cm$^2$.

5. The positional registration between each device unit and the laser spot is accomplished by movable platform and visual recognition system.

Although the above two techniques have resolved certain issues in lift-off technologies after industrial applications in the last several years, at the same time, several problems, as described below, still remain:

1. The KrF laser cannot maintain energy stability of the laser pulses. The energy fluctuations of the laser pulses can damage the structures within the device and lower yields.

2. The parameters of the laser lift-off cannot be adjusted accurately because the size of the laser spot must be adjusted according to chip size. As a result, lift off cannot be conducted consistently.

3. In recent years, the industry always questioned such large area lift-off method because of the large laser spot. The GaN decomposes simultaneously in the irradiation area which leads to large stress and deformation in the decomposition area, so as to imperil the quality and the service life of the chip. Although manual adjustment enables the GaN decomposition as accurate as possible, such macroscopic adjustment is difficult to meet the microcosmic requirement. In the meantime, it makes the laser adjustment more difficult because of the discreteness of the pulse energy of the KrF quasi-molecule laser.

SUMMARY OF THE INVENTION

The present invention aims to provide laser lift-off apparatus and lift-off method with higher reliability and more convenience, and at lower cost. The present invention discloses a laser lift-off method that adopts micro area laser lift-off (MicroAreaLLO) and high speed blind scanning without unnecessary accurate positioning, which enables the damage-free separation of GaN from the sapphire substrate.

The present invention provides a solid-state laser lift-off apparatus characterized by a solid-state laser, a light beam shaping lens, motors of oscillating mirrors, oscillating mirrors and a field lens, as well as a movable platform, and an industrial control computer and control software. The light beam shaping lens is under the solid-state laser. The oscillating mirrors, motors of oscillating mirrors and the field lens, light beam shaping lens are behind the solid-state laser, shaping the laser beam from the solid-state laser. The motors of oscillating mirrors are in front of the field lens, controlling the movement of the oscillating mirrors according to the instruction of the control software to implement different light beam scanning paths. The movable platform is under the solid-state laser. The control software runs in the industrial control computer.

In the solid-state laser lift-off apparatus of the present invention, the laser light beam shaping lens can shapes the laser spots into small laser spots in different geometric shapes.

In the solid-state laser lift-off apparatus of the present invention, the geometric shapes include square, rectangle, round, ellipse, pentagon and hexagon.

In the solid-state laser lift-off apparatus of the present invention, the small laser spot can include a square laser spot with a perimeter ranging from 3 µm to 1000 µm.

In the solid-state laser lift-off apparatus of the present invention, the small laser spot can include a round laser spot with a perimeters ranging from 3 µm to 300 µm.

In the solid-state laser lift-off apparatus of the present invention, the energy density of the small laser spot is the highest in the center and is gradually reduced toward the periphery.

In the solid-state laser lift-off apparatus of the present invention, the solid-state laser is a diode-pumped solid-state (DPSS) laser with a wavelength less than 400 nm.

In the solid-state laser lift-off apparatus of the present invention, the light scanning is produced by using the motors of oscillating mirrors to drive the oscillating mirrors.

The present invention also provides a method for applying the above-mentioned solid-state laser lift-off apparatus by scanning small laser spot.

In the lift-off method of the present invention, the small laser spot can be a square laser spot with a perimeter ranging from 3 µm to 1000 µm.

In the lift-off method of the present invention, the small laser spot can be a round laser spot with a diameter ranging from 3 µm to 300 µm.

In the lift-off method of the present invention, the energy of the small laser spot is the highest in the center and is gradually reduced toward the periphery.

In the lift-off method of the present invention, various different scanning paths can be used.

In the lift-off method of the present invention, the small laser spot can scan in any direction to achieve separation. The small laser spot does not need to be accurately positioned relative to the device chip during the scanning

BRIEF DESCRIPTION OF THE DRAWINGS

FIG. 3A shows an energy distribution in a laser spot in conventional laser lift-off techniques.

FIG. 3B shows an energy distribution of a laser spot in accordance with the present invention.

DETAILED DESCRIPTION OF THE INVENTION

Figure 1:
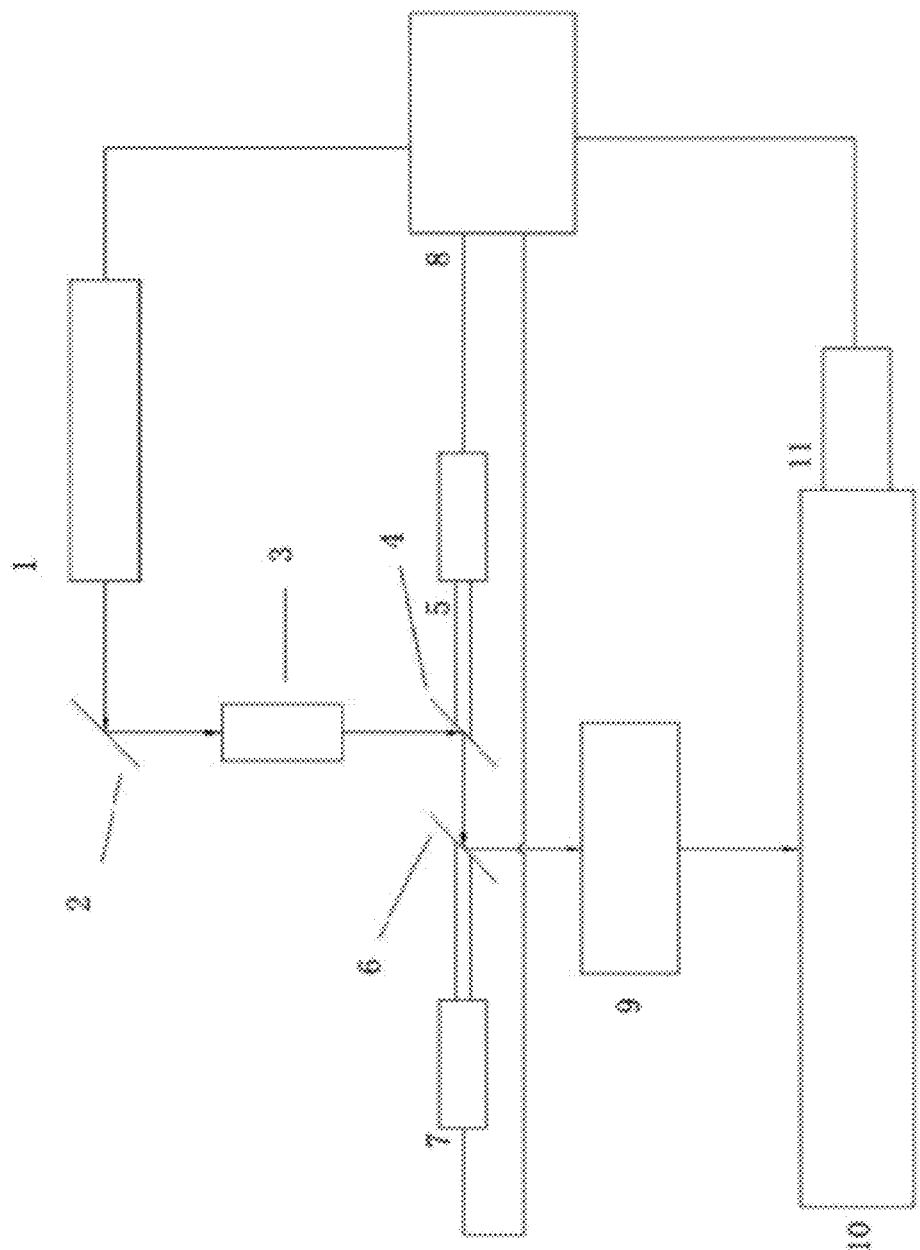
FIG. 1 is a schematic diagram of a solid-state laser lift-off apparatus in accordance with the present invention.

FIG. 1 is the schematic diagram of a lift-off apparatus which includes a solid-state laser 1, a mirror 2, a light beam shaping lens 3, oscillating mirrors 4,6, motors 5,7 for the oscillating mirrors 4,6, a field lens 9, a movable platform 10, a motor 11 for moving the platform 10, and an industrial control computer 8 installed with control software. The present invention can use a solid-state laser as the laser source. The light beam shaping lens 3, the oscillating mirrors 4,6, the motors 5,7 of oscillating lens, and the field lens 9 are positioned under the laser 1. The light beam shaping lens 3 is behind the laser 1, shaping a laser beam emitted from the laser into a required shape in accordance with the present invention. The motors 5,7 of the oscillating mirrors 4,6 control the movements of the oscillating mirrors 4,6 to move the light beam in intended scanning paths under the control of the control software.

According to the present invention, the lift-off apparatus and the lift-off method for separating GaN from a sapphire substrate can use solid-state laser as the laser source. A small laser spot produced by the laser source can have a perimeter of 3 µm~1000 µm. The maximum distance between two corners of the laser spot or a largest diameter of the laser spot is no more than 400 µm. The laser spot is scanned spot by spot, line by line. The energy distribution in the small laser spot is the highest in the center of the small laser spot and gradually decreases toward the periphery of the laser spot.

The present invention does not use the large laser spot used in conventional laser lift-off technologies. Instead, the present invention implements blind scanning small spot to separate the GaN film or GaN device, which removes the need for accurate positioning the laser spot relative to the device. Small laser spot has not been used because of three important reasons: (1) it is generally regarded that the small laser spot lift-off brings the laser spot edge problem into the GaN-based device unit, which leads to reduce the quality of the laser lift-off even worse; (2) it is generally regarded that the single pulse energy of the solid-state laser probably cannot reach the threshold value for laser lift-off; (3) there is no report to indicate that small laser spot can lift off device damage-free. The small laser spot adopted by the present invention has a perimeter of from 3 µm to 1000 µm, preferably between 100 µm and 400 µm. The maximum distance between two corners of the laser spot or a largest diameter of the laser spot is no more than 400 µm, preferably no more than 150 µm. The shape of the laser spot can be square, rectangle, round, ellipse, pentagon, hexagon, etc. Such small laser spot, for instance, is a square laser spot having a side ranging from 3 µm to 250 µm, or a round laser spot with a diameter from 1 µm to 300 µm.

Furthermore, the present invention adjusts the energy distribution in the laser spot to be different from conventional techniques. As shown in FIG. 3A, the conventional large laser spot has a uniform energy distribution. The energy on the edge of the large laser spot changes rapidly which can easily lead to damages to the device. In FIG. 3A, the x axis indicates the direction across a large laser spot with the center of the large laser spot at zero. The y axis indicates the amount of energy. In comparison, the energy distribution of the present invention is shown in FIG. 3B. The energy distribution in a small laser spot is non-uniform, and gradually decreases from the center to the edge of the small laser spot. In comparison to the large laser spot, the small laser spot in the present invention has gradually reduces energy from the center toward the edge of the laser spot, which reduces stress in the GaN substrate at the edge of the laser spot, and helps to achieve damage-free laser lift-off.

The solid-state laser used in the present invention can be an improved solid-state harmonic frequency laser source. The energy spatial distribution inside the laser spot is improved in that the energy density is the highest in the center of the laser spot and gradually decreases toward the periphery. The overall energy distribution in the laser spot can be, or similar to, a Gauss distribution, as shown in FIG. 3B.

Figure 9:
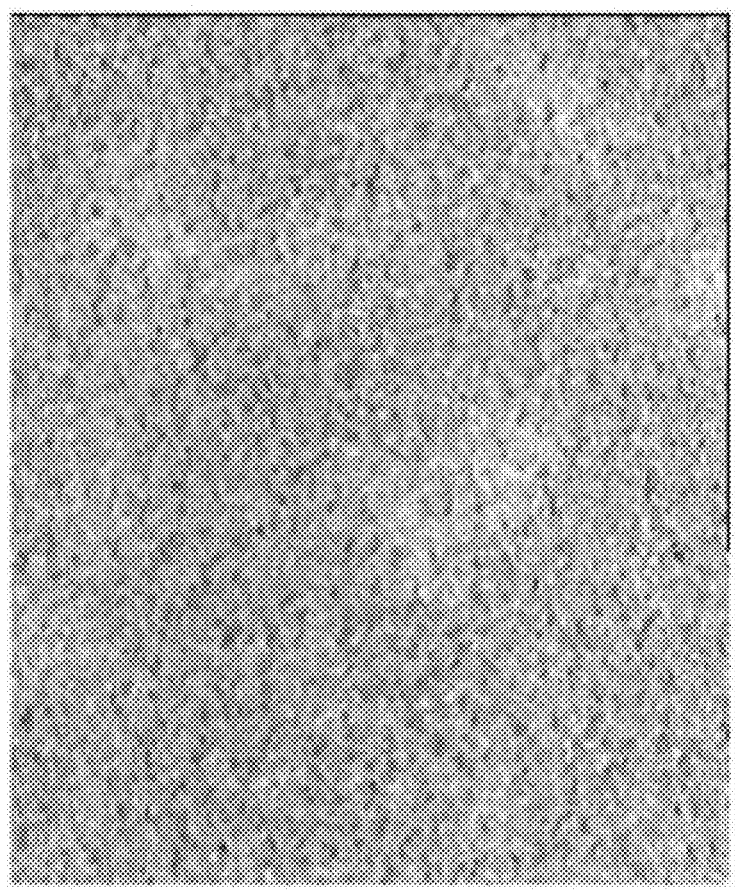
FIG. 9 is a microscopic photograph of a damage-free surface on the device after a separation using small laser spot laser lift-off technique in accordance with the present invention.
Figure 8:
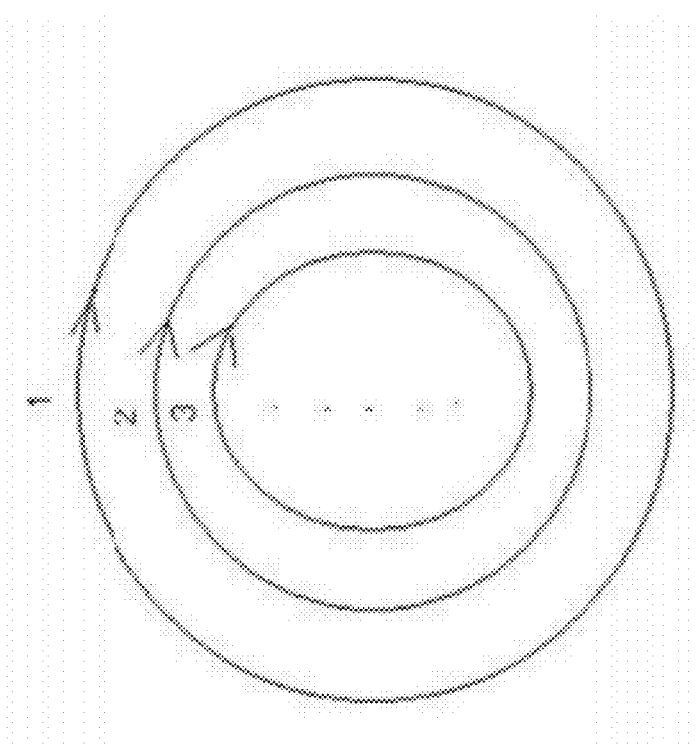

The present invention utilizes small laser spot to achieve damage-free laser lift-off. FIG. 9 shows an example of a lift-off surface free of apparent damage. The present invention achieves blind scanning in the lift-off without unnecessary accurate positioning between the laser spot and the chip. The present invention also improves the scanning mode of the laser lift-off. After electroplating or bonding steps, the presently disclosed method does not need to adjust the area of the laser spot according to the size of the GaN device or accurately position the laser spot relative to the GaN device. The presently disclosed method can directly carry out laser scanning without stopping for sizing or positioning the laser spot (which is necessary in the conventional techniques).

Figure 2:
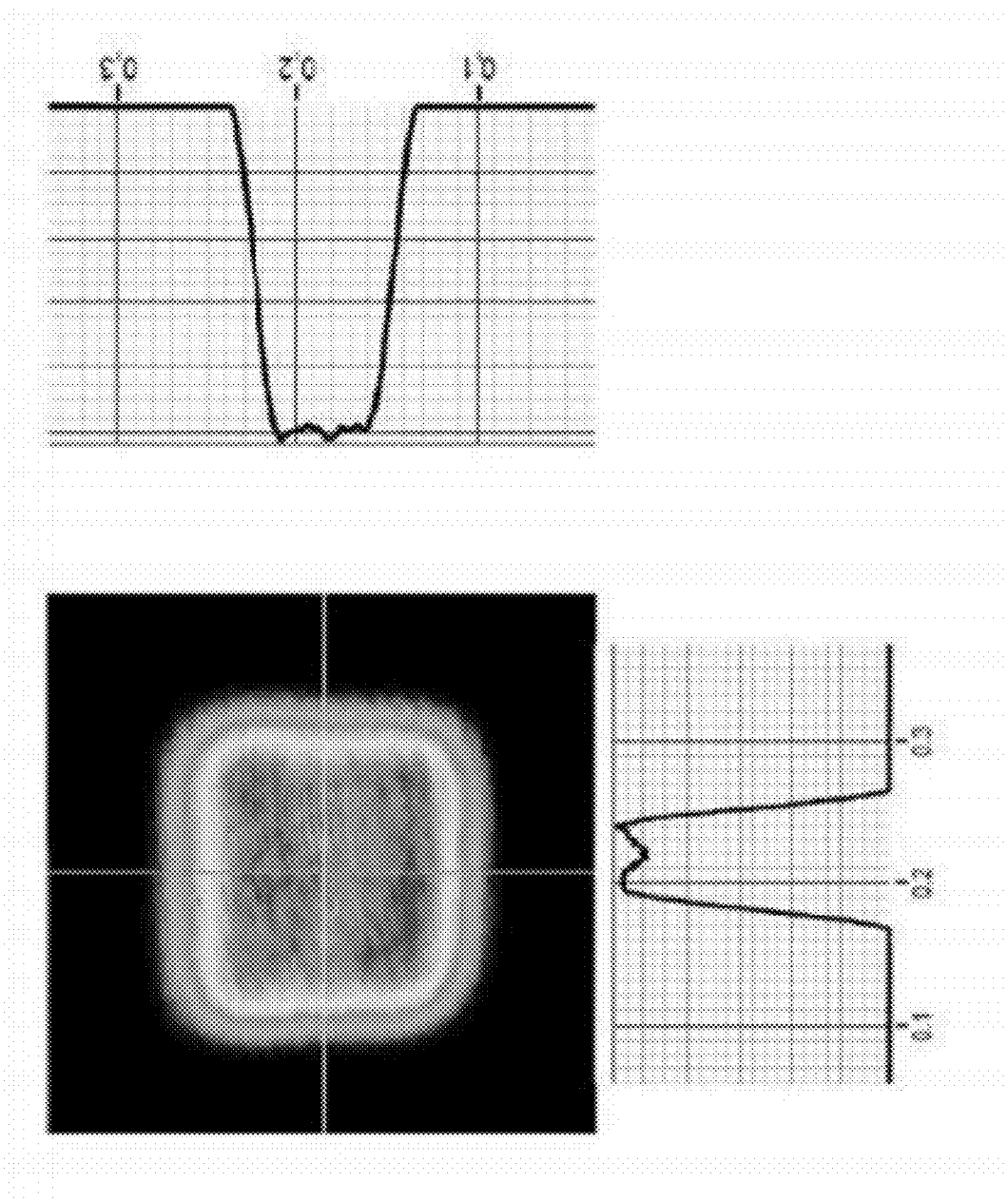
FIG. 2 is a schematic diagram showing the light beam shaping in accordance with the present invention.
Figure 5:
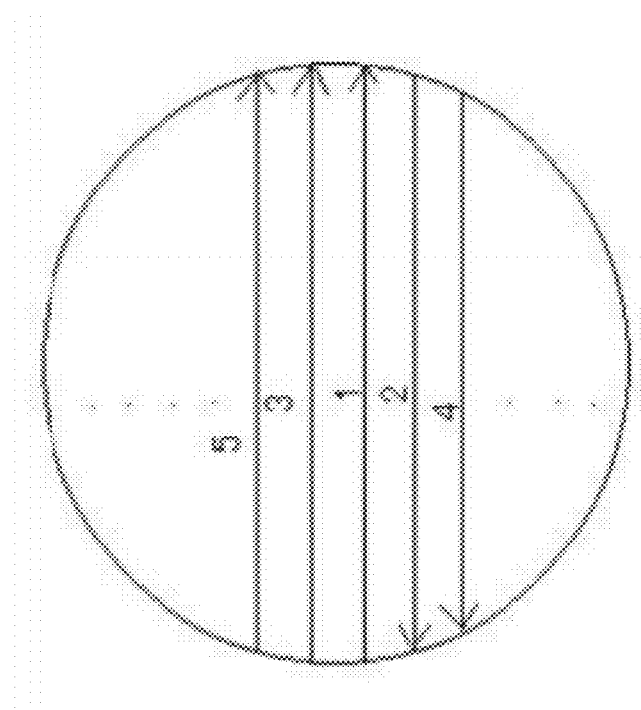
FIGS. 4-8 are schematic diagrams of the scanning paths of a laser spot in accordance with the present invention.
Figure 4:
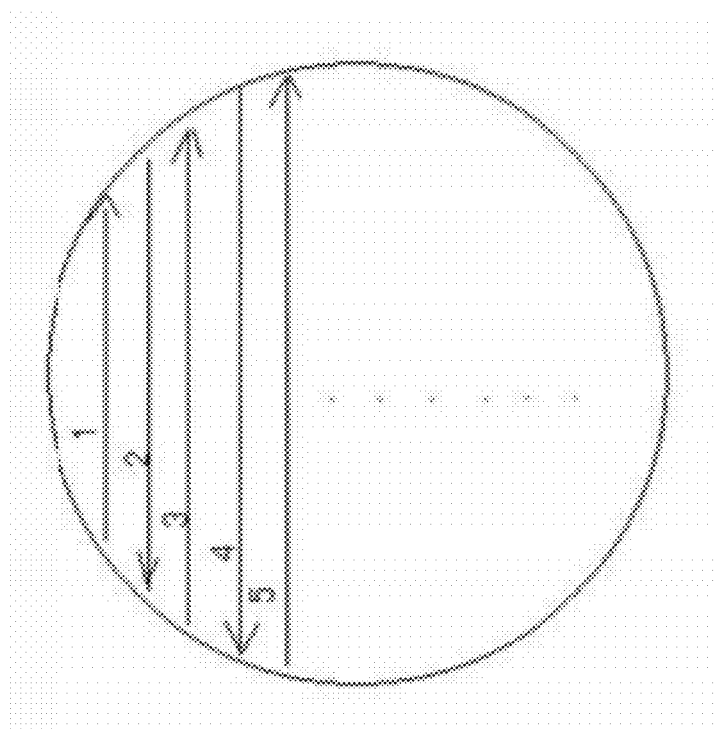
Figure 7:
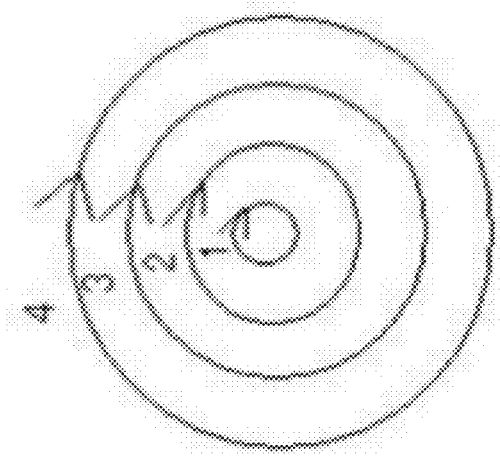
Figure 6:
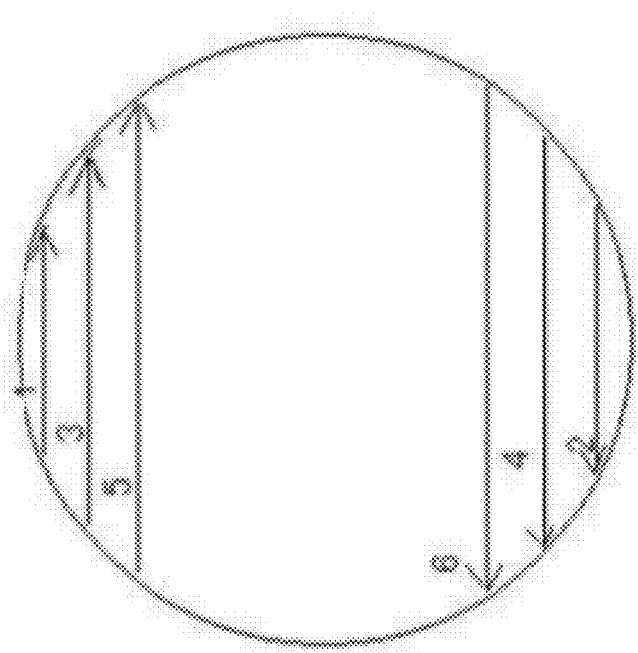

The present invention discloses s holistic light beam shaping system to change the spatial distribution of the light beam, which makes it beneficial to the energy distribution in the laser spot. The present invention also changes the requirement that the energy distribution from a conventional flat top distribution (FIG. 3A) to a Gaussian like distribution (FIG. 3B) with a narrower width at half height than the bottom of the distribution. This energy distribution is beneficial to transition between successive laser spot locations and can prevent damage of the substrate material. The principle of the light path is shown in FIG. 2.

The presently disclosed light scanning system uses a laser marking similar to laser marking, which has not been used in laser lift-off technologies possibly due to the difficulties in accurate positioning (for large laser spot). Light scanning is successfully implemented in the present invention system because the micro area laser lift-off (MALLO) technology has removed the need for accurate positioning of laser spot relative to the device. The principle of the light path is shown in FIG. 1.

Furthering the successful solution of blind scanning, the inventors of the present application have developed some special scanning lift-off solutions to address the problems existing in the conventional lift-off technologies, specifically, the persistent heating in the lift-off area caused by the laser pulse. Because the gallium droplets and nitrogen bubbles can form between the film layer and the substrate during the lift-off process, different scanning paths can produce different stress distributions. Therefore, the inventors developed different scanning paths to solve the stress problem during the lift-off process of the materials, which improves the yields.

FIGS. 4-8 illustrate several typical scanning paths of the present invention. The present invention adopts specific scanning paths, for instance, spiral scanning from inside to outside, concentric circle from inside to outside (FIG. 7), concentric circles from outside to inside (FIG. 8), and scanning alternatively up and down. An important advantage of the present invention is that it can choose different scanning strategies according to the characteristics of the device and the GaN films.

In comparison with conventional techniques, the advantageous effects of the present invention are: firstly, the laser lift-off process is drastically simplified. Secondly, the operating efficiency of laser lift-off is substantially improved. Thirdly, the failure rate is reduced. Fourthly, obstacles to commercialize laser lift-off are removed, which advances the laser lift-off in manufacturing processes.

What is claimed is:

1. A solid-state laser lift-off apparatus, comprising:
a solid-state laser, a light beam shaping lens, motors of oscillating mirrors, oscillating mirrors and a field lens, as well as a movable platform, an industrial control computer and control software; the said light beam shaping lens is under the laser; the said oscillating mirrors, the motors of oscillating mirrors and the field mirrors, the light beam shaping lens are behind the laser, shaping the laser beam from the said solid-state laser; the said motors of oscillating mirrors are in front of the said field lens, controlling the movement of the said oscillating mirrors according to the instruction of the control software to implement different light beam scanning paths, wherein the said light beam scanning paths are produced by using the motors of oscillating mirrors to drive the oscillating mirrors; the said platform is under the said solid-state laser; the said control software runs in the said industrial control computer.

2. The solid-state laser lift-off apparatus of claim 1, wherein the said light beam shaping lens shapes the laser spot into small laser spot in different geometric shapes.

3. The solid-state laser lift-off apparatus of claim 2, wherein the said geometric shapes include square, rectangle, round, ellipse, pentagon and hexagon.

4. The solid-state laser lift-off apparatus of claim 2, wherein the said small laser spot is a square laser spots with a perimeter of 3~1000 μm.

5. The solid-state laser lift-off apparatus of claim 2, wherein the said small laser spot is a round laser spot with a diameter of 3~300 μm.

6. The solid-state laser lift-off apparatus of claim 2, wherein the energy of the said small laser spot is the highest in the center and is gradually reduced toward the periphery.

7. The solid-state laser lift-off apparatus of claim 1, wherein the said solid-state laser is a Diode Pumped Solid-State solid-state laser with a wavelength less than 400 nm.

8. The solid-state laser lift-off apparatus of claim 1, wherein the said light scanning is produced by using the motors of oscillating mirrors to drive the oscillating mirrors.

* * * * *